(12) United States Patent
Seo et al.

(10) Patent No.: US 10,861,956 B2
(45) Date of Patent: Dec. 8, 2020

(54) THIN FILM TRANSISTOR SUBSTRATE AND RELATED DISPLAY DEVICE

(71) Applicant: Samsung Display Co., Ltd., Yongin-si (KR)

(72) Inventors: Ilhun Seo, Asan-si (KR); Yun-Mo Chung, Yongin-si (KR); Daewoo Lee, Hwaseong-si (KR); Tak-Young Lee, Anyang-si (KR); Miyeon Cho, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/273,029

(22) Filed: Feb. 11, 2019

(65) Prior Publication Data

US 2019/0334002 A1 Oct. 31, 2019

(30) Foreign Application Priority Data

Apr. 30, 2018 (KR) .................. 10-2018-0050239

(51) Int. Cl.
*H01L 29/04* (2006.01)
*H01L 29/66* (2006.01)
(Continued)

(52) U.S. Cl.
CPC .... *H01L 29/66757* (2013.01); *H01L 27/1225* (2013.01); *H01L 27/3258* (2013.01); *H01L 27/3262* (2013.01); *H01L 29/41733* (2013.01); *H01L 29/42384* (2013.01); *H01L 29/7869* (2013.01); *H01L 29/78618* (2013.01); *H01L 27/3246* (2013.01); *H01L 51/5218* (2013.01); *H01L 51/5221* (2013.01)

(58) Field of Classification Search
CPC .......... H01L 29/41733; H01L 27/3258; H01L 27/3262; H01L 27/3246; H01L 51/5218; H01L 51/5221; H01L 29/66757; H01L 29/78618; H01L 29/7869; H01L 27/1225; H01L 29/42384

See application file for complete search history.

(56) References Cited

U.S. PATENT DOCUMENTS 8,884,286 B2 * 11/2014 Lee .................. H01L 29/78606
257/43
10,012,879 B2 * 7/2018 Wen .................. G02F 1/136227
(Continued)

FOREIGN PATENT DOCUMENTS

KR 10-1715861 B1 3/2017
KR 10-2017-0044805 A 4/2017

*Primary Examiner* — Shouxiang Hu
(74) *Attorney, Agent, or Firm* — Innovation Counsel LLP

(57) ABSTRACT

A thin film transistor substrate may include a base substrate, a semiconductor member, a gate electrode, a first insulation layer, and a source/drain electrode. The semiconductor member may overlap the base substrate. The gate electrode may overlap the semiconductor member and may be insulated from the semiconductor member. The first insulation layer may be positioned on the gate electrode and may include a first contact hole. The source/drain electrode may include a first discharge hole, may be electrically connected to the semiconductor member, and may be at least partially positioned inside the first contact hole. The first discharge hole may partially expose the semiconductor member.

11 Claims, 12 Drawing Sheets

(51) Int. Cl.
*H01L 29/417* (2006.01)
*H01L 27/32* (2006.01)
*H01L 29/786* (2006.01)
*H01L 29/423* (2006.01)
*H01L 27/12* (2006.01)
*H01L 51/52* (2006.01)

(56) References Cited

U.S. PATENT DOCUMENTS

2012/0326157 A1* 12/2012 Park ................. H01L 29/66757
257/72
2012/0326174 A1* 12/2012 Park ................. H01L 29/42384
257/88
2014/0061632 A1* 3/2014 Lee .................... H01L 27/1244
257/43

* cited by examiner

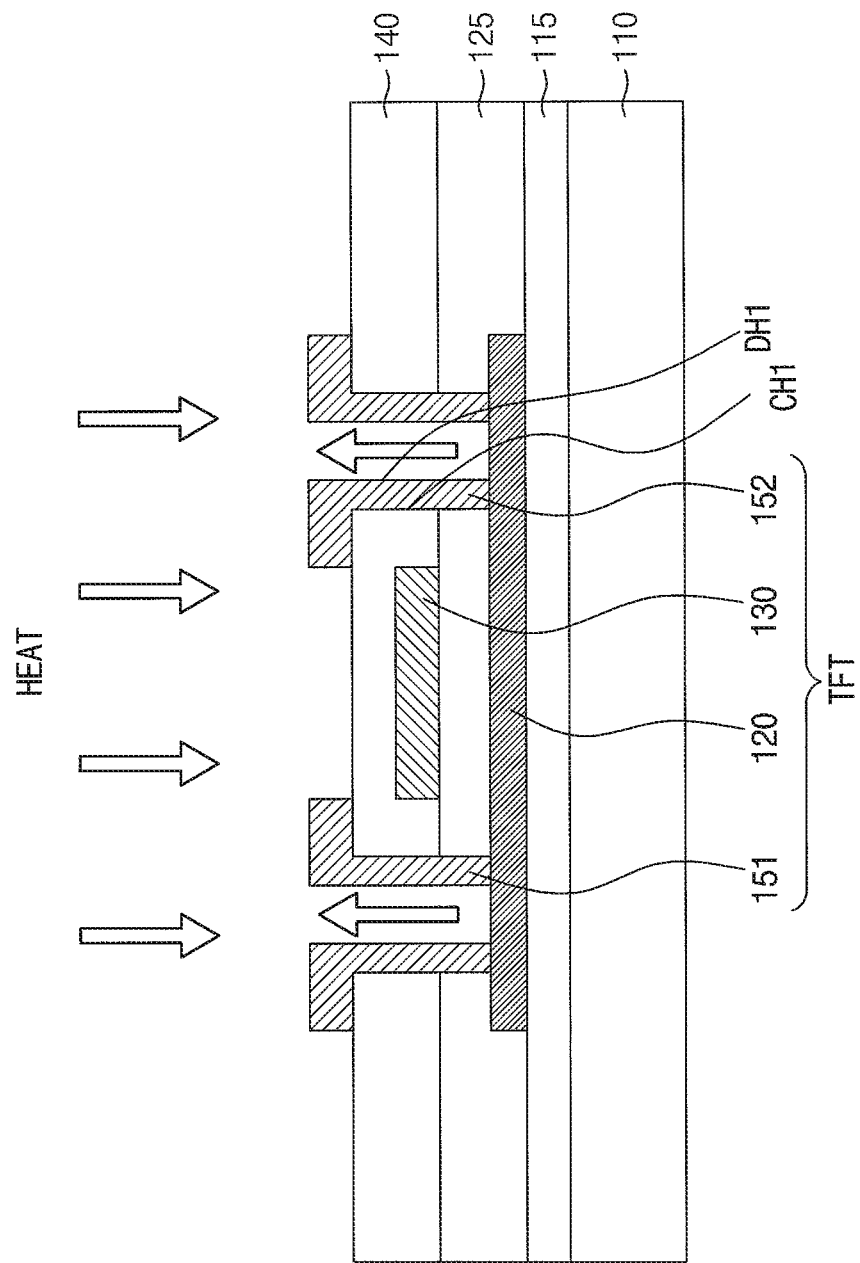

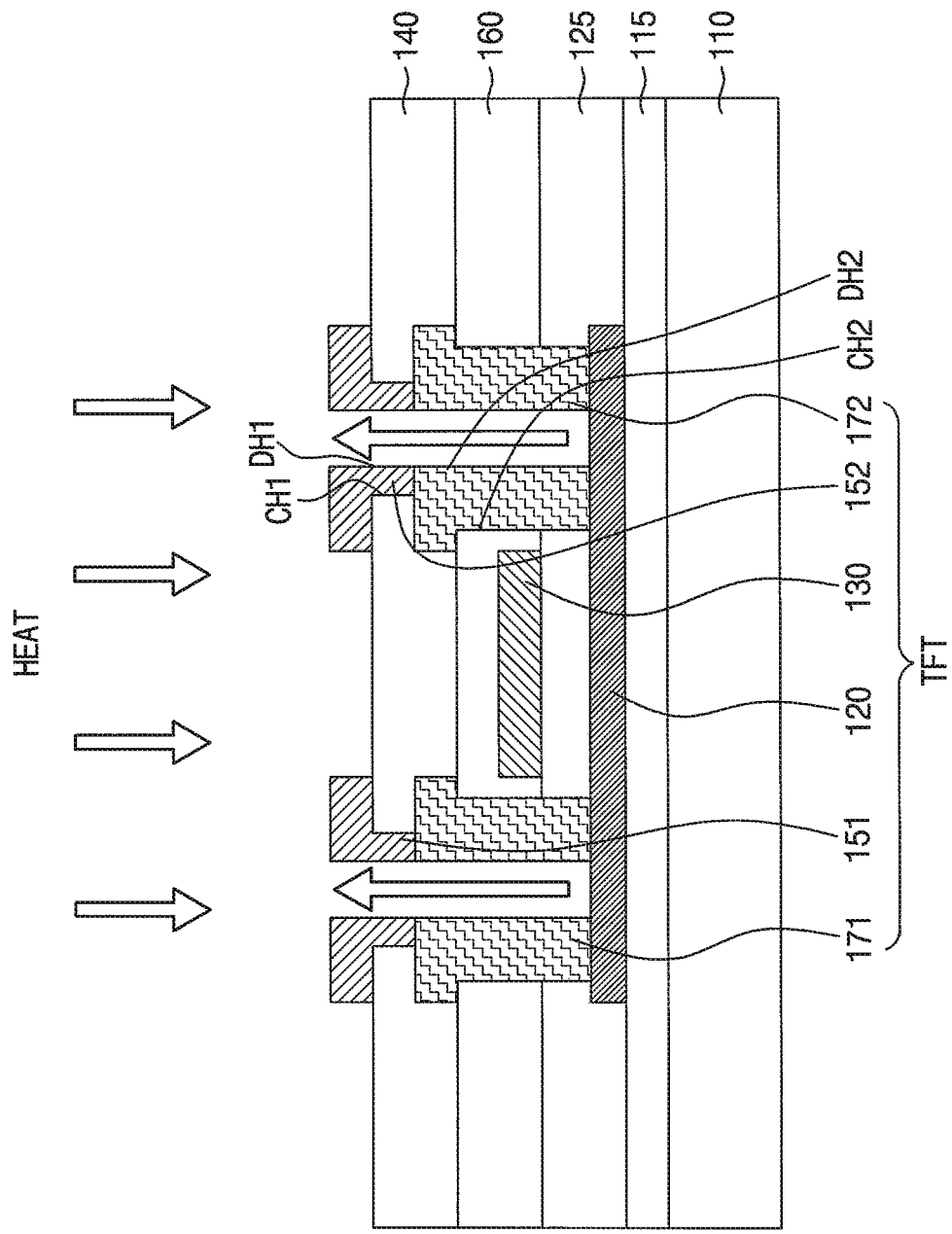

THIN FILM TRANSISTOR SUBSTRATE AND RELATED DISPLAY DEVICE

CROSS-REFERENCE TO RELATED APPLICATION(S)

This application claims priority under 35 USC § 119 to Korean Patent Application No. 10-2018-0050239, filed on Apr. 30, 2018 in the Korean Intellectual Property Office (KIPO); the entire disclosure of the Korean Patent Application is incorporated by reference herein.

BACKGROUND

1. Field

The technical field relates to a thin film transistor substrate, a method of manufacturing a thin film transistor substrate, and a display device including a thin film transistor substrate.

2. Description of the Related Art

An organic light emitting display device may have an organic light emitting element. The organic light emitting display device may not require a separate light source to generate light, and thus the organic light emitting display device may have a small thickness, a light weight, and low power consumption. Furthermore, the organic light emitting display device may have a wide viewing angle, a high contrast, and a high response speed.

The organic light emitting element may emit light based on current transmitted from a thin film transistor.

SUMMARY

Embodiments may be related to a thin film transistor substrate including a thin film transistor with improved characteristics.

A thin film transistor substrate according to embodiments may include a base substrate, an active pattern on the base substrate, a gate electrode on the active pattern and insulated from the active pattern, an insulation interlayer on the gate electrode, a contact hole being defined in the insulation interlayer, and a source electrode and a drain electrode on the insulation interlayer and electrically connected to the active pattern through the contact hole. A discharge hole exposing the active pattern may be defined in at least one of the source electrode and the drain electrode.

In an embodiment, the discharge hole may be in the contact hole.

In an embodiment, a width of the contact hole may be in a range from about 0.5 µm to about 1.5 µm.

In an embodiment, the thin film transistor substrate may further include an additional insulation interlayer between the gate electrode and the insulation interlayer, an additional contact hole being defined in the additional insulation interlayer and a source connection electrode and a drain connection electrode between the additional insulation interlayer and the insulation interlayer, respectively in contact with the source electrode and the drain electrode, and electrically connected to the active pattern through the additional contact hole. An additional discharge hole exposing the active pattern may be defined in at least one of the source connection electrode and the drain connection electrode.

In an embodiment, the additional discharge hole may be in the additional contact hole.

In an embodiment, a width of the additional contact hole may be in a range from about 0.5 µm to about 1.5 µm.

In an embodiment, a width of the additional contact hole may be greater than a width of the contact hole.

In order to achieve the object described above, a method of manufacturing a thin film transistor substrate according to embodiments may include forming an active pattern on a base substrate, forming a gate electrode insulated from the active pattern on the active pattern, forming an insulation interlayer on the gate electrode, forming a contact hole in the insulation interlayer, and forming a source electrode and a drain electrode electrically connected to the active pattern through the contact hole on the insulation interlayer. A discharge hole exposing the active pattern may be defined in at least one of the source electrode and the drain electrode.

In an embodiment, the source electrode and the drain electrode may be deposited on a sidewall of the contact hole.

In an embodiment, a width of the contact hole is in a range from about 0.5 µm to about 1.5 µm.

In an embodiment, a deposition rate of the source electrode and the drain electrode may be faster than a deposition rate of the gate electrode.

In an embodiment, the method may further include performing a heat treatment of the active pattern after forming of the source electrode and the drain electrode.

In an embodiment, the method may further include after forming the gate electrode and before forming the insulation interlayer forming an additional insulation interlayer on the gate electrode, forming an additional contact hole in the additional insulation interlayer, and forming a source connection electrode and a drain connection electrode respectively in contact with the source electrode and the drain electrode and electrically connected to the active pattern through the additional contact hole on the additional insulation interlayer. An additional discharge hole exposing the active pattern may be defined in at least one of the source connection electrode and the drain connection electrode.

In an embodiment, the source connection electrode and the drain connection electrode may be deposited on a sidewall of the additional contact hole.

In an embodiment, a width of the additional contact hole may be in a range from about 0.5 µm to about 1.5 µm.

In an embodiment, a deposition rate of the source connection electrode and the drain connection electrode may be faster than a deposition rate of the gate electrode.

In order to achieve the object described above, a display device according to embodiments may include a base substrate, an active pattern on the base substrate, a gate electrode on the active pattern and insulated from the active pattern, an insulation interlayer on the gate electrode, a contact hole being defined in the insulation interlayer, a source electrode and a drain electrode on the insulation interlayer and electrically connected to the active pattern through the contact hole, a planarization layer on the source electrode and the drain electrode, and a first electrode electrically connected to the source electrode or the drain electrode, an emission layer, and a second electrode on the planarization layer. A discharge hole exposing the active pattern may be defined in at least one of the source electrode and the drain electrode.

In an embodiment, the discharge hole may be in the contact hole.

In an embodiment, a width of the contact hole may be in a range from about 0.5 µm to about 1.5 µm.

In an embodiment, the planarization layer or the first electrode may fill the discharge hole.

An embodiment may be related to a thin film transistor substrate. The thin film transistor substrate may include a base substrate, a semiconductor member, a gate electrode, a first insulation layer, and a source/drain electrode. The semiconductor member may overlap the base substrate. The gate electrode may overlap the semiconductor member and may be insulated from the semiconductor member. The first insulation layer may be positioned on the gate electrode and may include a first contact hole. The source/drain electrode may include a first discharge hole, may be electrically connected to the semiconductor member, and may be at least partially positioned inside the first contact hole. The first discharge hole may partially expose the semiconductor member.

The first discharge hole may be in the first contact hole.

A width of the first contact hole may be in a range from 0.5 μm to 1.5 μm.

The thin film transistor substrate may include the following elements: a second insulation layer positioned between the gate electrode and the first insulation layer and including a second contact hole; and a source/drain connection electrode including a second discharge hole, electrically connected to each of the source/drain electrode and the semiconductor member, and at least partially positioned inside the second contact hole. The second discharge hole may partially expose the semiconductor member.

The second discharge hole may be in the second contact hole.

A width of the second contact hole may be in a range from 0.5 μm to 1.5 μm.

A width of the second contact hole may be greater than a width of the first contact hole.

An embodiment may be related to a method of manufacturing a thin film transistor substrate. The method may include the following steps: forming a semiconductor member on a base substrate; forming a gate electrode insulated from the semiconductor member on the semiconductor member; forming a first insulation layer on the gate electrode; forming a first contact hole in the first insulation layer; and forming a source/drain electrode that includes a first discharge hole, may be electrically connected to the semiconductor member, and may be at least partially positioned inside the contact hole. The first discharge hole may partially expose the semiconductor member.

The source/drain electrode may be deposited on a sidewall of the first contact hole.

A width of the first contact hole may be in a range from 0.5 μm to 1.5 μm.

A deposition rate of the source/drain may be faster than a deposition rate of the gate electrode.

The method may include performing a heat treatment of the semiconductor member after forming of the source/drain electrode.

The method may include the following steps after forming the gate electrode and before forming the first insulation layer: forming a second insulation layer on the gate electrode; forming a second contact hole in the second insulation layer; and forming a source/drain connection electrode that includes a second discharge hole, is electrically connected to each of the source/drain electrode and the semiconductor member, and is at least partially positioned inside the second contact hole. The second discharge hole may partially expose the semiconductor member.

The source/drain connection electrode may be deposited on a sidewall of the second contact hole.

A width of the second contact hole may be in a range from 0.5 μm to 1.5 μm.

A deposition rate of the source/drain connection electrode may be faster than a deposition rate of the gate electrode.

An embodiment may be related to a display device. The display device may include the following elements: a base substrate; a semiconductor member overlapping the base substrate; a gate electrode overlapping the semiconductor member and insulated from the semiconductor member; a insulation layer positioned on the gate electrode and including a contact hole; a source/drain electrode including a discharge hole, electrically connected to the semiconductor member, and at least partially positioned inside the contact hole; a planarization layer positioned on the source/drain electrode; and a light emitting element electrically connected to the source/drain electrode and positioned on the planarization layer. The discharge hole may partially expose the semiconductor member.

The discharge hole may be in the contact hole.

A width of the contact hole may be in a range from 0.5 μm to 1.5 μm.

The planarization layer or an electrode of the light emitting element may fill the discharge hole.

In embodiments, materials of an active pattern (or semiconductor member) may be smoothly discharged through a discharge hole in a source/drain electrode. Advantageously, characteristics of the thin film transistor that includes the active pattern may be improved.

BRIEF DESCRIPTION OF THE DRAWINGS

FIG. 3A, FIG. 3B, and FIG. 3C are cross-sectional views illustrating structures formed in a method of manufacturing the thin film transistor substrate in FIG. 1 according to an embodiment.

FIG. 5A, FIG. 5B, FIG. 5C, FIG. 5D, and FIG. 5E are cross-sectional views illustrating structures formed in a method of manufacturing the thin film transistor substrate in FIG. 4 according to an embodiment.

DETAILED DESCRIPTION

Thin film transistor substrates, methods of manufacturing thin film transistor substrates, and display devices in accordance with embodiments are described with reference to the accompanying drawings. Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. The term "connect" may mean "electrically connect"; the term "insulate" may mean "electrically insulate."

Figure 1:
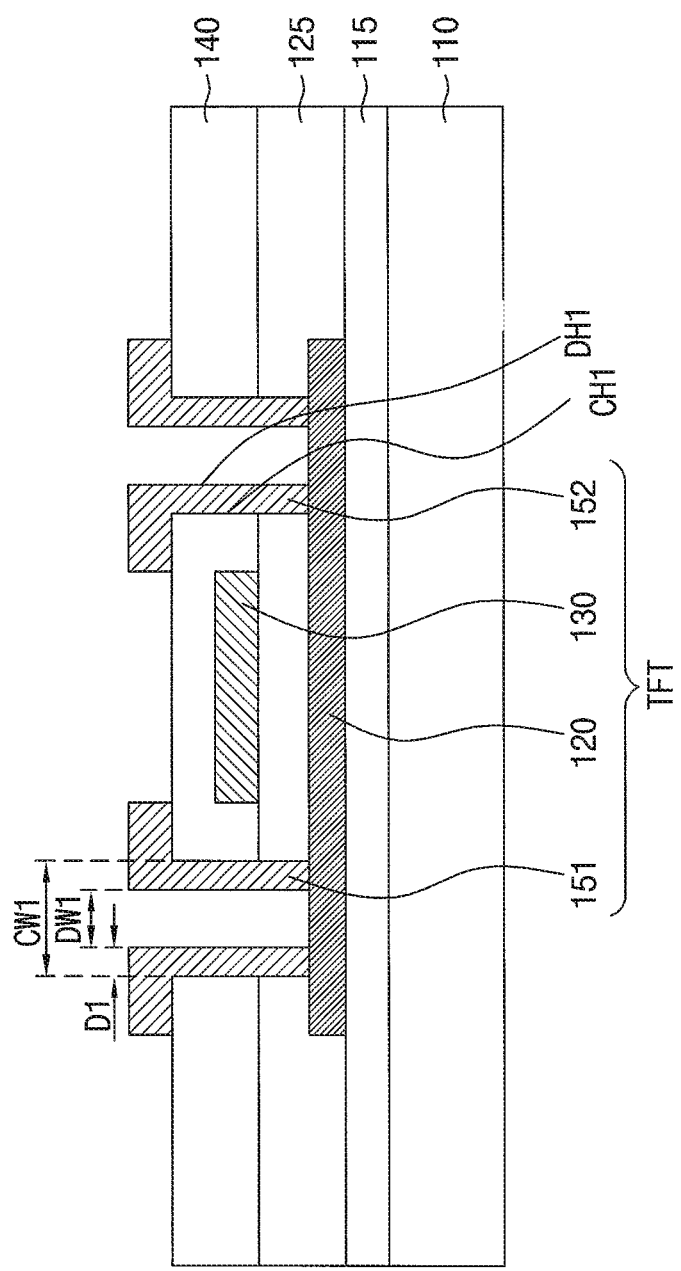
FIG. 1 is a cross-sectional view illustrating a thin film transistor substrate according to an embodiment.

FIG. 1 is a cross-sectional view illustrating a thin film transistor substrate according to an embodiment.

Referring to FIG. 1, a thin film transistor substrate according to an embodiment may include a base substrate 110, a buffer layer 115, a gate insulation layer 125, an insulation interlayer 140, and a thin film transistor TFT. The thin film transistor TFT may include an active pattern 120 (or semiconductor member 120), a gate electrode 130, a source electrode 151, and a drain electrode 152.

The base substrate 110 may be formed of glass, quartz, plastic, or the like.

The buffer layer 115 may be disposed on the base substrate 110. The buffer layer 115 may prevent impurities from permeating through the base substrate 110. The buffer layer 115 may provide a planarized surface. In an embodiment, the buffer layer 115 may be unnecessary.

The thin film transistor TFT may be disposed on the buffer layer 115. The thin film transistor substrate may include a thin film transistor having a top-gate structure. In an embodiment, the thin film transistor substrate may include a thin film transistor having a bottom-gate structure.

The active pattern 120 may be disposed on the buffer layer 115. The active pattern 120 may include amorphous silicon, polycrystalline silicon, etc. In an embodiment, the active pattern 120 may include an oxide semiconductor. The active pattern 120 may include a source region and a drain region located at opposite ends of the active pattern 120; the active pattern 120 may include a channel region located between the source region and the drain region.

The gate insulation layer 125 covering the active pattern 120 may be disposed on the buffer layer 115. The gate insulation layer 125 may insulate the gate electrode 130 from the active pattern 120. The gate insulation layer 125 may include silicon nitride, silicon oxide, or the like.

The gate electrode 130 may be disposed on the gate insulation layer 125. The gate electrode 130 may overlap a portion of the active pattern 120. For example, the gate electrode 130 may overlap the channel region of the active pattern 120. The gate electrode 130 may include gold (Au), silver (Ag), copper (Cu), nickel (Ni), platinum (Pt), palladium (Pa), aluminum (Al), molybdenum (Mo), or titanium (Ti).

The insulation interlayer 140 covering the gate electrode 130 may be disposed on the gate insulation layer 125. The insulation interlayer 140 may insulate the source electrode 151 and the drain electrode 152 from the gate electrode 130. The insulation interlayer 140 may include silicon nitride, silicon oxide, or the like.

A contact hole CH1 may be defined (and/or included) in the insulation interlayer 140. The contact hole CH1 may pass/extend through the gate insulation layer 125 and the insulation interlayer 140, and may expose a portion of the active pattern 120. For example, two contact holes CH1 may be defined in the insulation interlayer 140, and the contact holes CH1 may expose the source region and the drain region of the active pattern 120, respectively. A contact hole of the layer 140 in combination with a contact hole of the layer may form the contact hole CH1.

The source electrode 151 and the drain electrode 152 may be disposed on the insulation interlayer 140. The source electrode 151 and the drain electrode 152 may be electrically connected to the active pattern 120. The source electrode 151 and the drain electrode 152 may be in (direct) contact with the active pattern 120 through the contact holes CH1, respectively. For example, the source electrode 151 may be in contact with the source region of the active pattern 120 through a contact hole CH1, and the drain electrode 152 may be in contact with the drain region of the active pattern 120 through another contact hole CH1. The source electrode 151 and the drain electrode 152 may include Au, Ag, Cu, Ni, Pt, Pa, Al, Mo, or Ti. For example, the source electrode 151 and the drain electrode 152 may include a multi-layered structure such as Ti/Al/Ti.

A discharge hole DH1 (partially) exposing the active pattern 120 may be defined (and included) in at least one of the source electrode 151 and the drain electrode 152. In an embodiment, a discharge hole DH1 may be defined (and included) in each of the source electrode 151 and the drain electrode 152. In an embodiment, the discharge hole DH1 may be defined in either of the source electrode 151 and the drain electrode 152.

A discharge hole DH1 may pass/extend through at least one of the source electrode 151 and the drain electrode 152, and may expose an upper surface of the active pattern 120. For example, one discharge hole DH1 may be defined in each of the source electrode 151 and the drain electrode 152. The discharge hole DH1 defined in the source electrode 151 may expose the source region of the active pattern 120, and the discharge hole DH1 defined in the drain electrode 152 may expose the drain region of the active pattern 120.

Figure 2:
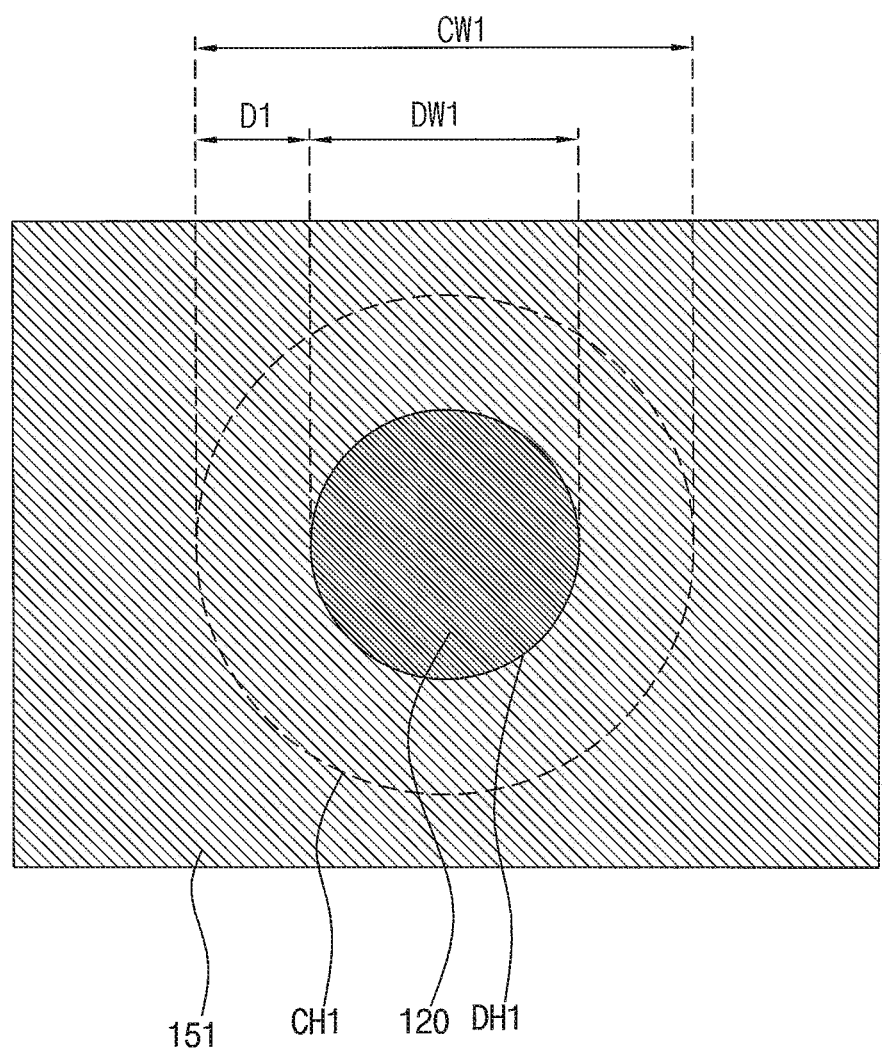
FIG. 2 is a plan view illustrating a contact hole and a discharge hole of the thin film transistor substrate in FIG. 1 according to an embodiment.

FIG. 2 is a plan view illustrating the contact hole CH1 and the discharge hole DH1 of the thin film transistor substrate in FIG. 1.

Referring to FIGS. 1 and 2, the discharge hole DH1 may be located in/inside and/or surrounded by the contact hole CH1. A (maximum) width DW1 of the discharge hole DH1 may be less than a (maximum) width CW1 of the contact hole CH1. In an embodiment, each of the discharge hole DH1 and the contact hole CH1 may have a substantial circular shape in a plan view. In this case, a diameter of the discharge hole DH1 may be less than a diameter of the contact hole CH1.

The width CW1 of each contact hole CH1 may be in a range from about 0.5 μm to about 1.5 μm. If the width CW1 of each contact hole CH1 is greater than about 1.5 μm, the source electrode 151 and the drain electrode 152 may completely cover the upper surface portions of the active pattern 120 exposed by the contact holes CH1, so that the upper surface of the active pattern 120 may not be exposed. If the width CW1 of each contact hole CH1 is less than about 0.5 μm, the source electrode 151 and the drain electrode 152 may completely fill the contact holes CH1, so that no discharge holes DH1 may be formed.

In a contact hole CH1, the corresponding source electrode 151 or drain electrode 152 may be formed on a sidewall of the contact hole CH1. Each of the source electrode 151 and the drain electrode 152 may have a donut shape in a plan view in the contact hole CH1.

A thickness D1 of each of the source electrode 151 and the drain electrode 152 in the corresponding contact hole CH1 may be in a range from about 0.2 μm to about 0.6 μm. The thickness D1 of each of the source electrode 151 and the drain electrode 152 in the corresponding contact hole CH1 may be a minimum distance from the sidewall of the corresponding contact hole CH1 to a sidewall of the corresponding discharge hole DH1, a half of the difference between the widths CW1 and DW1, or a difference between the radius of the corresponding contact hole CH1 and the radius of the corresponding discharge hole DH1.

Figure 3A:
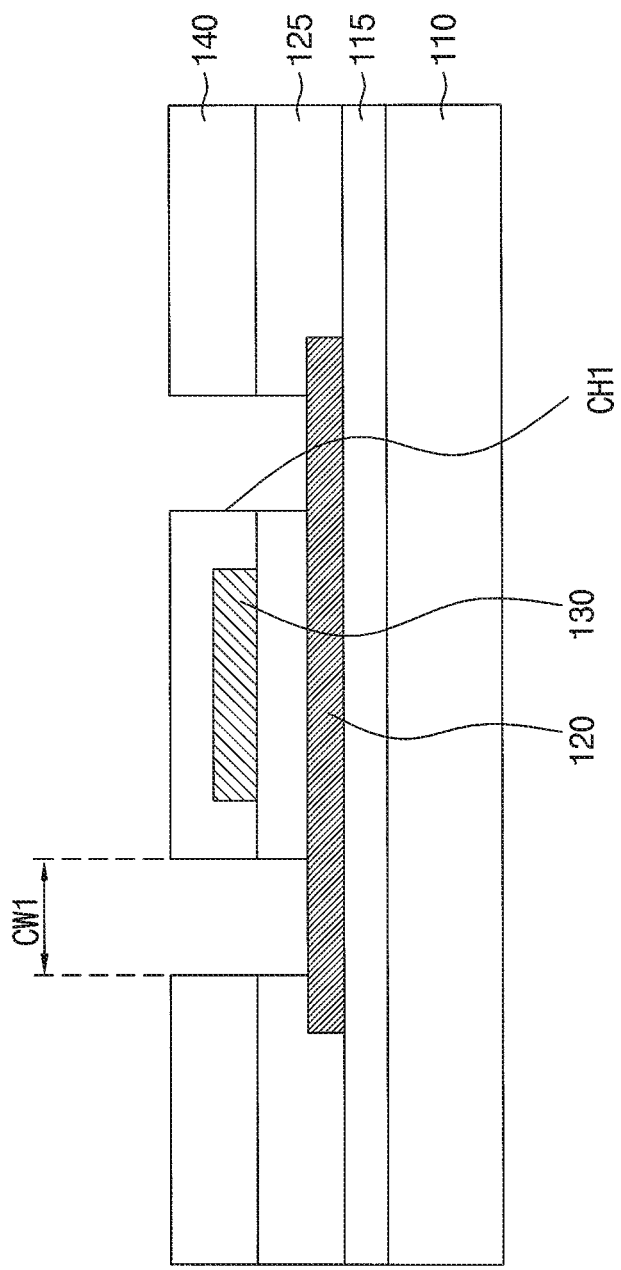
Figure 3B:
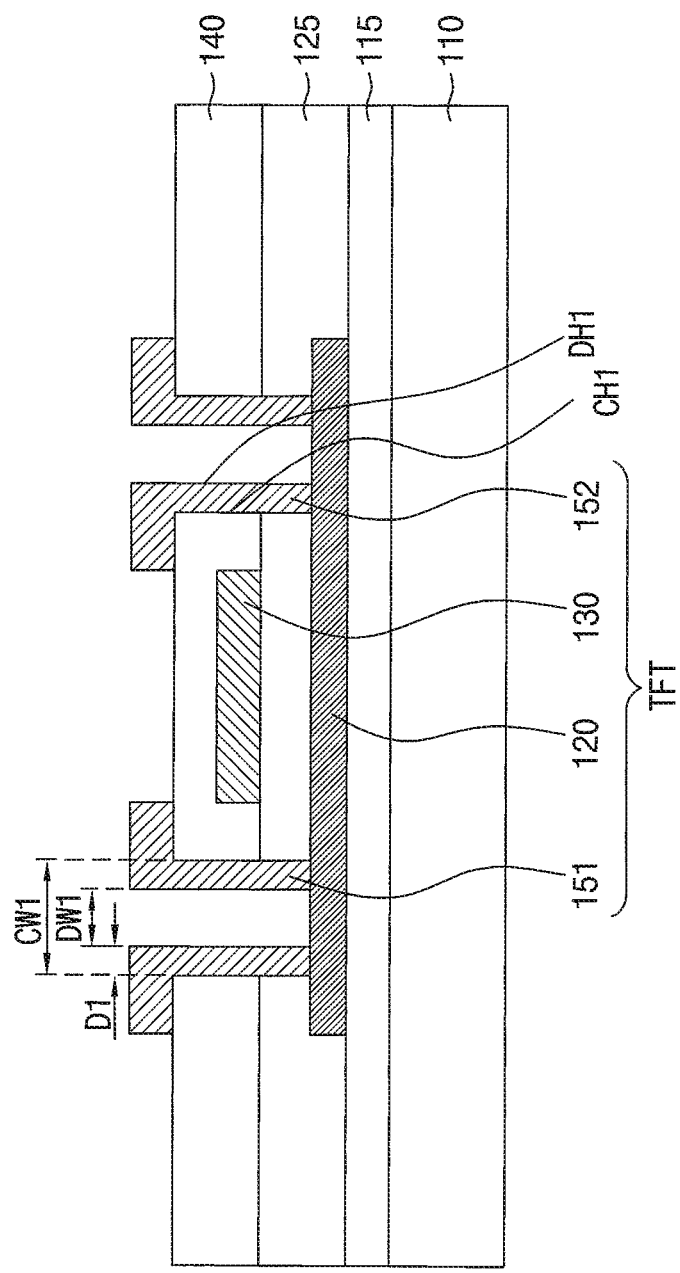

FIGS. 3A, 3B, and 3C are cross-sectional views illustrating a method of manufacturing the thin film transistor substrate in FIG. 1.

Referring to FIG. 3A, the active pattern 120, the gate electrode 130, and the insulation interlayer 140 may be formed on the base substrate 110, and the contact hole CH1 may be formed in the insulation interlayer 140.

First, the buffer layer 115 may be formed on the base substrate 110, and the active pattern 120 may be formed on the buffer layer 115. For example, a semiconductor layer may be deposited on the buffer layer 115, and the semiconductor layer may be etched by a photolithography process to form the active pattern 120.

Then, the gate insulation layer 125 covering the active pattern 120 may be formed on the buffer layer 115, and the gate electrode 130 may be formed on the gate insulation layer 125. For example, a first conductive layer may be deposited on the gate insulation layer 125, and the first conductive layer may be etched by a photolithography process to form the gate electrode 130.

The gate electrode 130 may be deposited in a relatively slow deposition rate. For example, the first conductive layer may be deposited on the gate insulation layer 125 in a relatively slow deposition rate.

Then, the insulation interlayer 140 covering the gate electrode 130 may be formed on the gate insulation layer 125. For example, the buffer layer 115, the gate insulation layer 125, and the insulation interlayer 140 may be formed of at least one of silicon oxide, silicon nitride, etc. using at least one of chemical vapor deposition, sputtering, etc.

Then, the contact hole CH1 may be formed in the insulation interlayer 140. For example, portions in the gate insulation layer 125 and the insulation interlayer 140 corresponding to the source region and the drain region of the active pattern 120 may be etched by a photolithography process to form two contact holes CH1.

The width CW1 of each contact hole CH1 may be in a range from about 0.5 μm to about 1.5 μm. If the width CW1 of each contact hole CH1 is greater than about 1.5 μm, the source electrode 151 and the drain electrode 152 may completely cover the upper surface portions of the active pattern 120 exposed by the contact hole CH1 in a subsequent process in which the source electrode 151 and the drain electrode 152 are formed, so that the upper surface of the active pattern 120 may not be exposed. If the width CW1 of each contact hole CH1 is less than about 0.5 μm, the source electrode 151 and the drain electrode 152 may completely fill the contact holes CH1 in the subsequent process in which the source electrode 151 and the drain electrode 152 are formed, so that no discharge holes DH1 may be formed.

Referring to FIG. 3B, the source electrode 151 and the drain electrode 152 electrically connected to the active pattern 120 and extending through the contact hole CH1 may be formed on the insulation interlayer 140. For example, a second conductive layer may be deposited on the insulation interlayer 140, and the second conductive layer may be etched by a photolithography process to form the source electrode 151 and the drain electrode 152.

Each of the source electrode 151 and the drain electrode 152 may be deposited on a sidewall of the corresponding contact hole CH1. Each of the source electrode 151 and the drain electrode 152 may not significantly cover the upper surface portion of the active pattern 120 exposed by the corresponding contact hole CH1. Accordingly, a discharge hole DH1 partially exposing the upper surface of the active pattern 120 may be defined in each contact hole CH1.

Each of the source electrode 151 and the drain electrode 152 may be deposited on the sidewall of the corresponding contact hole CH1 with a predetermined thickness D1. The thickness D1 of each of the source electrode 151 and the drain electrode 152 formed on the sidewall of the contact hole CH1 may be in a range from about 0.2 μm to about 0.6 μm.

The source electrode 151 and the drain electrode 152 may be deposited in a relatively fast deposition rate. For example, the second conductive layer may be deposited on the sidewall of each contact hole CH1 in a relatively fast deposition rate. A deposition rate of the source electrode 151 and the drain electrode 152 may be faster than a deposition rate of the gate electrode 130.

The maximum width CW1 of each contact hole CH1 may be less than about 1.5 μm, so that an area of the upper surface of the active pattern 120 exposed by the contact hole CH1 may be less than an area of the sidewall of the corresponding contact hole CH1. Since the deposition rate of the source electrode 151 and the drain electrode 152 is relatively fast, and since the opening of the corresponding contact hole CH1 is substantially small, the source electrode 151 and the drain electrode 152 may be primarily formed on the sidewall of the contact hole CH1 having a relatively large area, and may not be significantly formed on the upper surface of the active pattern 120 having a relatively small area. Accordingly, a discharge hole DH1 exposing the upper surface of the active pattern 120 may be formed in each contact hole CH1.

Referring to FIG. 3C, heat treatment of the active pattern 120 may be performed after the formation of the source electrode 151 and the drain electrode 152, which include discharge holes DH1. For example, heat may be provided to the active pattern 120 from a heat source disposed outside the thin film transistor substrate. As a result, unwanted materials (e.g., hydrogen and ion) may be discharged through the discharge holes DH1 from the heat-treated active pattern 120.

Characteristics of the thin film transistor TFT may be improved as a result of the heat treatment of the active pattern 120. For example, a driving range of the thin film transistor TFT may be reduced by the heat treatment, so that the thin film transistor TFT may be insensitive to the change of current or voltage.

If the heat treatment is performed before the formation of the source electrode and the drain electrode, heat may not be transferred enough to the active pattern because the active pattern is surrounded by insulation layer having relatively low heat conductivity. If the heat treatment is performed after the formation of the source electrode and the drain electrode that completely fill the contact hole, unwanted materials may not be discharged.

According to embodiments, the source electrode 151 and the drain electrode 152 in contact with the active pattern 120 may be formed, and the discharge holes DH1 exposing the active pattern 120 may be formed in the source electrode 151 and the drain electrode 152. Therefore, sufficient heat may be transferred to the active pattern 120 through the source electrode 151 and the drain electrode 152, and unwanted materials of the active pattern 120 may be smoothly discharged through the discharge holes DH1.

Figure 4:
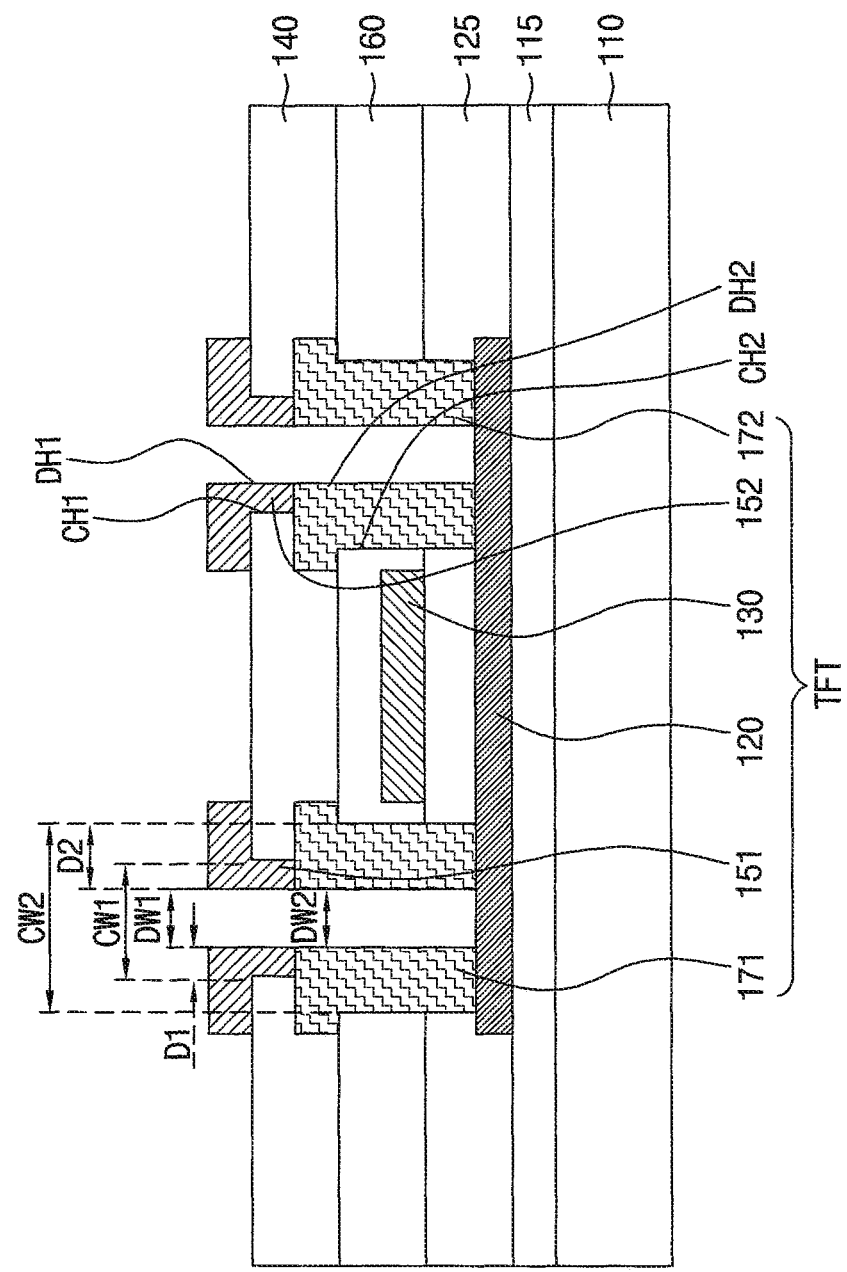
FIG. 4 is a cross-sectional view illustrating a thin film transistor substrate according to an embodiment.

FIG. 4 is a cross-sectional view illustrating a thin film transistor substrate according to an embodiment.

Referring to FIG. 4, a thin film transistor substrate according to an embodiment may include a base substrate 110, a buffer layer 115, a gate insulation layer 125, an additional insulation interlayer 160, an insulation interlayer 140, and a thin film transistor TFT. The thin film transistor TFT may include an active pattern 120, a gate electrode 130, a source connection electrode 171, a drain connection electrode 172, a source electrode 151, and a drain electrode 152. Some elements of the thin film transistor substrate described with reference to FIG. 4 may be substantially the same as or similar to some elements of the thin film transistor substrate illustrated in FIG. 1.

The additional insulation interlayer 160 covering the gate electrode 130 may be disposed between the gate insulation layer 125 and the insulation interlayer 140. The additional insulation interlayer 160 may insulate the source connection electrode 171 and the drain connection electrode 172 from the gate electrode 130. The additional insulation interlayer 160 may include silicon nitride, silicon oxide, or the like.

An additional contact hole CH2 may be defined (and/or included) in the additional insulation interlayer 160. The additional contact hole CH2 may pass/extend through the gate insulation layer 125 and the additional insulation interlayer 160, and may expose a portion of the active pattern 120. For example, two additional contact holes CH2 may be defined in the additional insulation interlayer 160, and the additional contact holes CH2 may expose the source region and the drain region of the active pattern 120, respectively.

The source connection electrode 171 and the drain connection electrode 172 may be disposed between the additional insulation interlayer 160 and the insulation interlayer 140. The source connection electrode 171 and the drain connection electrode 172 may be in (direct) contact with the source electrode 151 and the drain electrode 152, respectively. The source connection electrode 171 and the drain connection electrode 172 may be electrically connected to the active pattern 120. The source connection electrode 171 and the drain connection electrode 172 may be in (direct) contact with the active pattern 120 through the additional contact holes CH2, respectively. For example, the source connection electrode 171 may be in contact with the source region of the active pattern 120 through an additional contact hole CH2, and the drain connection electrode 172 may be in contact with the drain region of the active pattern 120 through another additional contact hole CH2. The source connection electrode 171 and the drain connection electrode 172 may include Au, Ag, Cu, Ni, Pt, Pa, Al, Mo, or Ti.

An additional discharge hole DH2 exposing the active pattern 120 may be defined in at least one of the source connection electrode 171 and the drain connection electrode 172. In an embodiment, the additional discharge hole DH2 may be defined in each of the source connection electrode 171 and the drain connection electrode 172. In an embodiment, the additional discharge hole DH2 may be defined in either of the source connection electrode 171 and the drain connection electrode 172. For example, when the discharge hole DH1 is only defined in the source electrode 151 (or the drain electrode 152), the additional discharge hole DH2 may be only defined in the source connection electrode 171 (or the drain connection electrode 172).

An additional discharge hole DH2 may pass through a corresponding one of the source connection electrode 171 and the drain connection electrode 172, and may expose an upper surface of the active pattern 120. For example, one additional discharge hole DH2 may be defined in each of the source connection electrode 171 and the drain connection electrode 172. The additional discharge hole DH2 defined in the source connection electrode 171 may expose the source region of the active pattern 120, and the additional discharge hole DH2 defined in the drain connection electrode 172 may expose the drain region of the active pattern 120.

Each additional discharge hole DH2 may be located in a corresponding additional contact hole CH2. A (maximum) width DW2 of the additional discharge hole DH2 may be less than a (maximum) width CW2 of the additional contact hole CH2. In an embodiment, each of the additional discharge hole DH2 and the additional contact hole CH2 may have a substantial circular shape in a plan view. In this case, a diameter of the additional discharge hole DH2 may be less than a diameter of the additional contact hole CH2.

The width CW2 of the additional contact hole CH2 may be in a range from about 0.5 µm to about 1.5 µm. If the width CW2 of the additional contact hole CH2 is greater than about 1.5 µm, the source connection electrode 171 and the drain connection electrode 172 may completely cover upper surface portions of the active pattern 120 exposed by the additional contact hole CH2, so that the upper surface of the active pattern 120 may not be exposed. If the width CW2 of the additional contact hole CH2 is less than about 0.5 µm, the source connection electrode 171 and the drain additional electrode 172 may completely fill the additional contact holes CH2, so that no additional discharge holes DH2 may be formed.

In an additional contact hole CH2, the corresponding source connection electrode 171 or drain connection electrode 172 may be formed on a sidewall of the additional contact hole CH2. Each of the source connection electrode 171 and the drain connection electrode 172 may have a donut shape in a plan view in the additional contact hole CH2.

A thickness D2 of each of the source connection electrode 171 and the drain connection electrode 172 in the corresponding additional contact hole CH2 may be in a range from about 0.2 µm to about 0.6 µm. The thickness D2 of each of the source connection electrode 171 and the drain connection electrode 172 in the corresponding additional contact hole CH2 may be a minimum distance from the sidewall of the additional contact hole CH2 to a sidewall of the additional discharge hole DH2, a half of the difference between the widths CW2 and DW2, or a difference between the radius of the corresponding contact hole CH2 and the radius of the corresponding discharge hole DH2.

In an embodiment, the width CW2 of an additional contact hole CH2 may be greater than the width CW1 of the corresponding contact hole CH1. The width DW2 of an additional discharge hole DH2 may be substantially equal to or less than the width DW1 of the corresponding discharge hole DH1.

FIGS. 5A, 5B, 5C, 5D, and 5E are cross-sectional views illustrating a method of manufacturing the thin film transistor substrate in FIG. 4.

Some elements and steps of the method of manufacturing a thin film transistor substrate illustrated in FIGS. 5A, 5B, 5C, 5D, and 5E may be substantially the same as or similar to some elements and steps of the method of manufacturing a thin film transistor substrate described with reference to FIGS. 3A, 3B, and 3C.

Figure 5A:
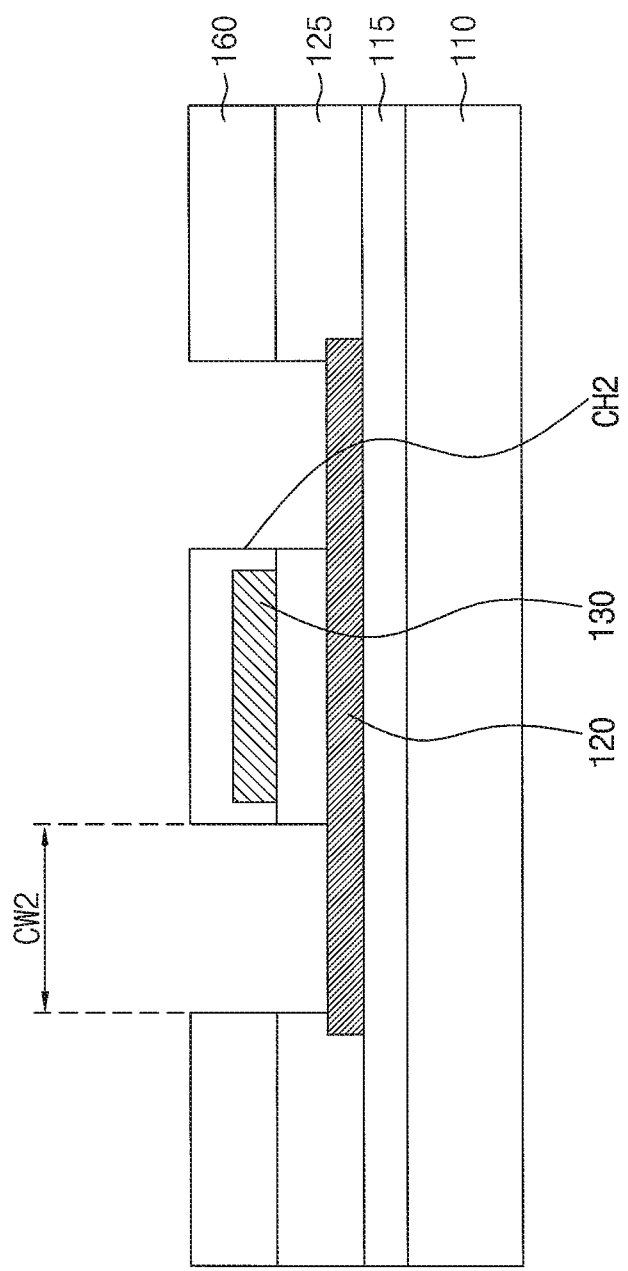

Referring to FIG. 5A, the active pattern 120, the gate electrode 130, and the additional insulation interlayer 160 may be formed on the base substrate 110, and the additional contact hole CH2 may be formed in the additional insulation interlayer 160.

The additional insulation interlayer 160 covering the gate electrode 130 may be formed on the gate insulation layer 125. For example, the additional insulation interlayer 160 may be formed of at least one of silicon oxide, silicon nitride, etc. using at least one of chemical vapor deposition, sputtering, etc.

Then, the additional contact hole CH2 may be formed in the additional insulation interlayer 160. For example, portions in the gate insulation layer 125 and the additional insulation interlayer 160 corresponding to the source region and the drain region of the active pattern 120 may be etched by a photolithography process to form two additional contact holes CH2.

The width CW2 of each additional contact hole CH2 may be in a range from about 0.5 µm to about 1.5 µm. If the width CW2 of each additional contact hole CH2 is greater than about 1.5 µm, the source connection electrode 171 and the drain connection electrode 172 may completely cover upper surface portions of the active pattern 120 exposed by the additional contact holes CH2 in a subsequent process in which the source connection electrode 171 and the drain connection electrode 172 are formed, so that the upper surface of the active pattern 120 may not be exposed. If the width CW2 of each additional contact hole CH2 is less than about 0.5 µm, the source connection electrode 171 and the drain connection electrode 172 may completely fill the additional contact holes CH2 in the subsequent process in which the source connection electrode 171 and the drain connection electrode 172 are formed, so that no additional discharge holes DH2 may be formed.

Figure 5B:
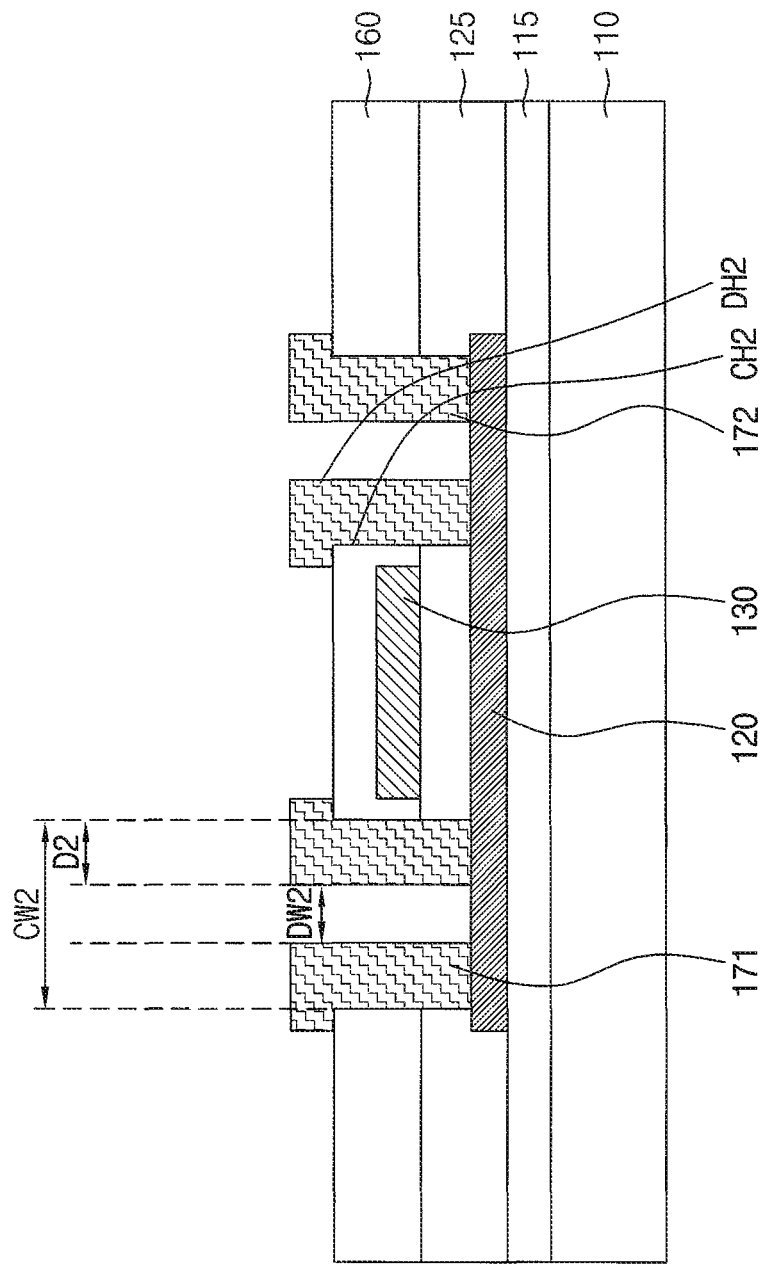

Referring to FIG. 5B, the source connection electrode 171 and the drain connection electrode 172 electrically connected to the active pattern 120 and extending through the additional contact hole CH2 may be formed on the additional insulation interlayer 160. For example, an additional conductive layer may be deposited on the additional insulation interlayer 160, and the additional conductive layer may be etched by a photolithography process to form the source connection electrode 171 and the drain connection electrode 172.

Each of the source connection electrode 171 and the drain connection electrode 172 may be deposited on a sidewall of the corresponding additional contact hole CH2. Each of the source connection electrode 171 and the drain connection electrode 172 may not significantly cover the upper surface portion of the active pattern 120 exposed by the corresponding additional contact hole CH2. Accordingly, an additional discharge hole DH2 partially exposing the upper surface of the active pattern 120 may be defined in each additional contact hole CH2.

Each of the source connection electrode 171 and the drain connection electrode 172 may be deposited on the sidewall of the corresponding additional contact hole CH2 with a predetermined thickness D2. The thickness D2 of each of the source connection electrode 171 and the drain connection electrode 172 formed on the sidewall of the additional contact hole CH2 may be in a range from about 0.2 µm to about 0.6 µm. The source connection electrode 171 and the drain connection electrode 172 may be deposited in a relatively fast deposition rate. For example, the additional conductive layer may be deposited on the sidewall of each additional contact hole CH2 in a relatively fast deposition rate. A deposition rate of the source connection electrode 171 and the drain connection electrode 172 may be faster than a deposition rate of the gate electrode 130.

The maximum width CW2 of each additional contact hole CH2 may be less than about 1.5 µm, so that an area of the upper surface of the active pattern 120 exposed by the additional contact hole CH2 may be less than an area of the sidewall of the corresponding additional contact hole CH2. Since the deposition rate of the source connection electrode 171 and the drain connection electrode 172 is relatively fast, and since the opening of the corresponding additional contact hole CH2 is substantially small, the source connection electrode 171 and the drain connection electrode 172 may be primarily formed on the sidewall of the additional contact hole CH2 having a relatively large area, and may not be significantly formed on the upper surface of the active pattern 120 having a relatively small area. Accordingly, an additional discharge hole DH2 exposing the upper surface of the active pattern 120 may be formed in each additional contact hole CH2.

Figure 5C:
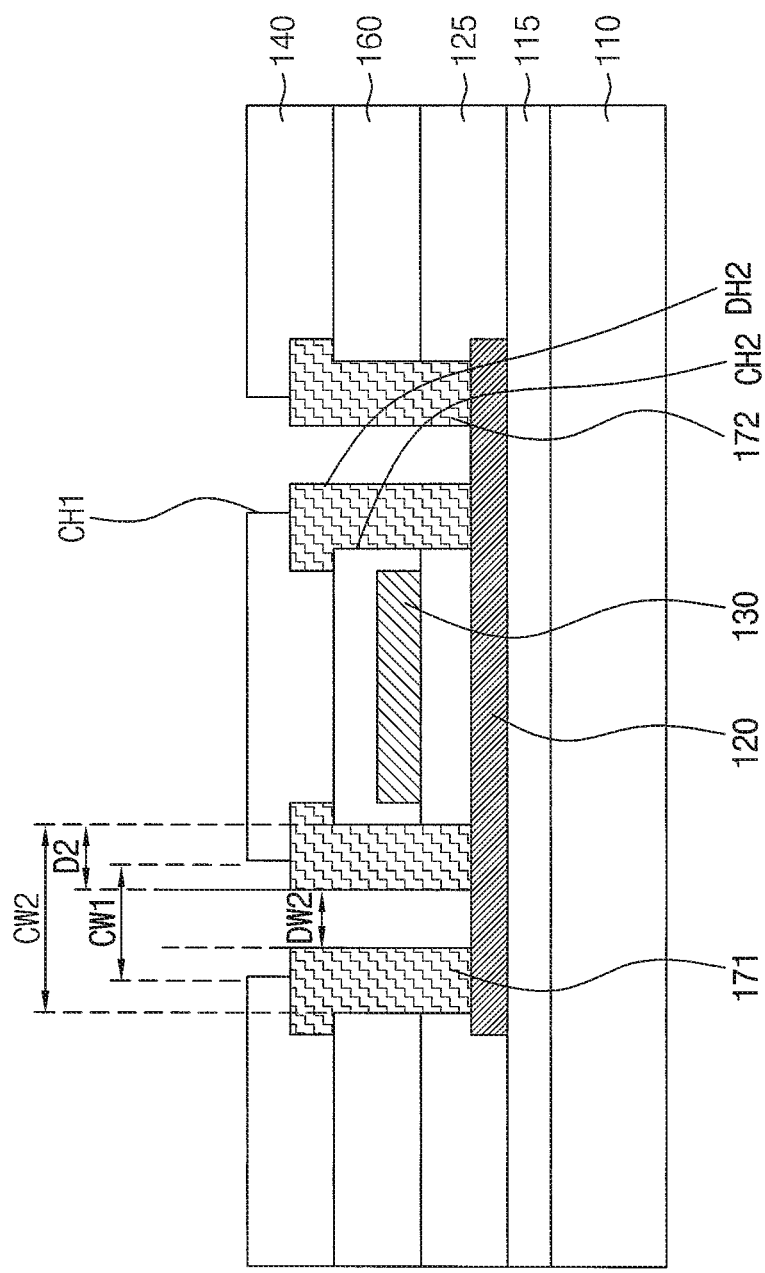

Referring to FIG. 5C, the insulation interlayer 140 covering the source connection electrode 171 and the drain connection electrode 172 may be formed on the additional insulation interlayer 160. Then, a contact hole CH1 corresponding to each additional contact hole CH2 may be formed in the insulation interlayer 140. In an embodiment, a width of a contact hole CH1 may be less than a width of the corresponding additional contact hole CH2.

Figure 5D:
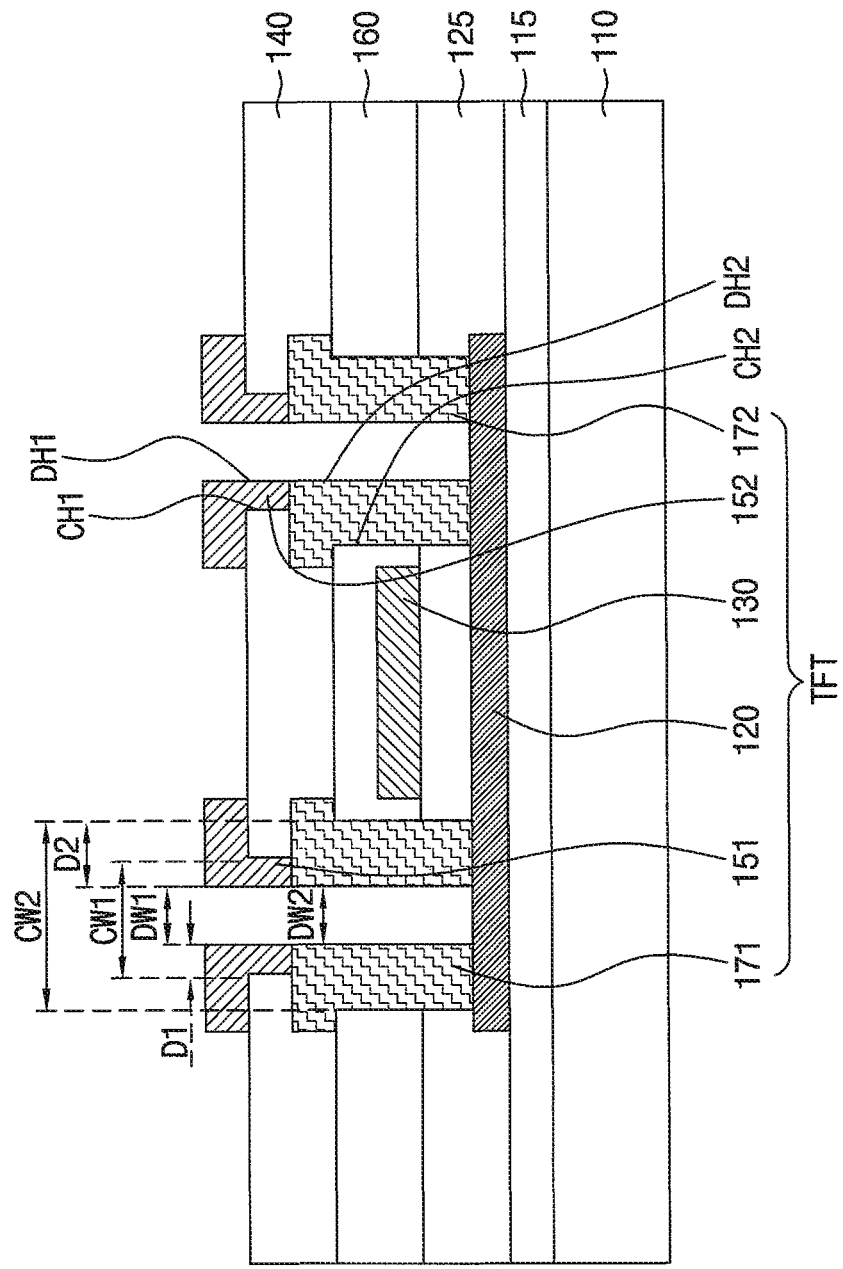

Referring to FIG. 5D, the source electrode 151 and the drain electrode 152 electrically connected to the active pattern 120 and extending through the contact holes CH1 may be formed on the insulation interlayer 140. The source electrode 151 and the drain electrode 152 may be in contact with the source connection electrode 171 and the drain connection electrode 172, respectively.

Referring to FIG. 5E, heat treatment of the active pattern 120 may be performed after the formation of the source electrode 151 and the drain electrode 152, which include discharge holes DH1. For example, heat may be provided to the active pattern 120 from a heat source disposed outside the thin film transistor substrate. As a result, unwanted materials (e.g., hydrogen and ion) may be discharged through the additional discharge hole DH2 and the discharge hole DH1 from the heat-treated active pattern 120.

Figure 6:
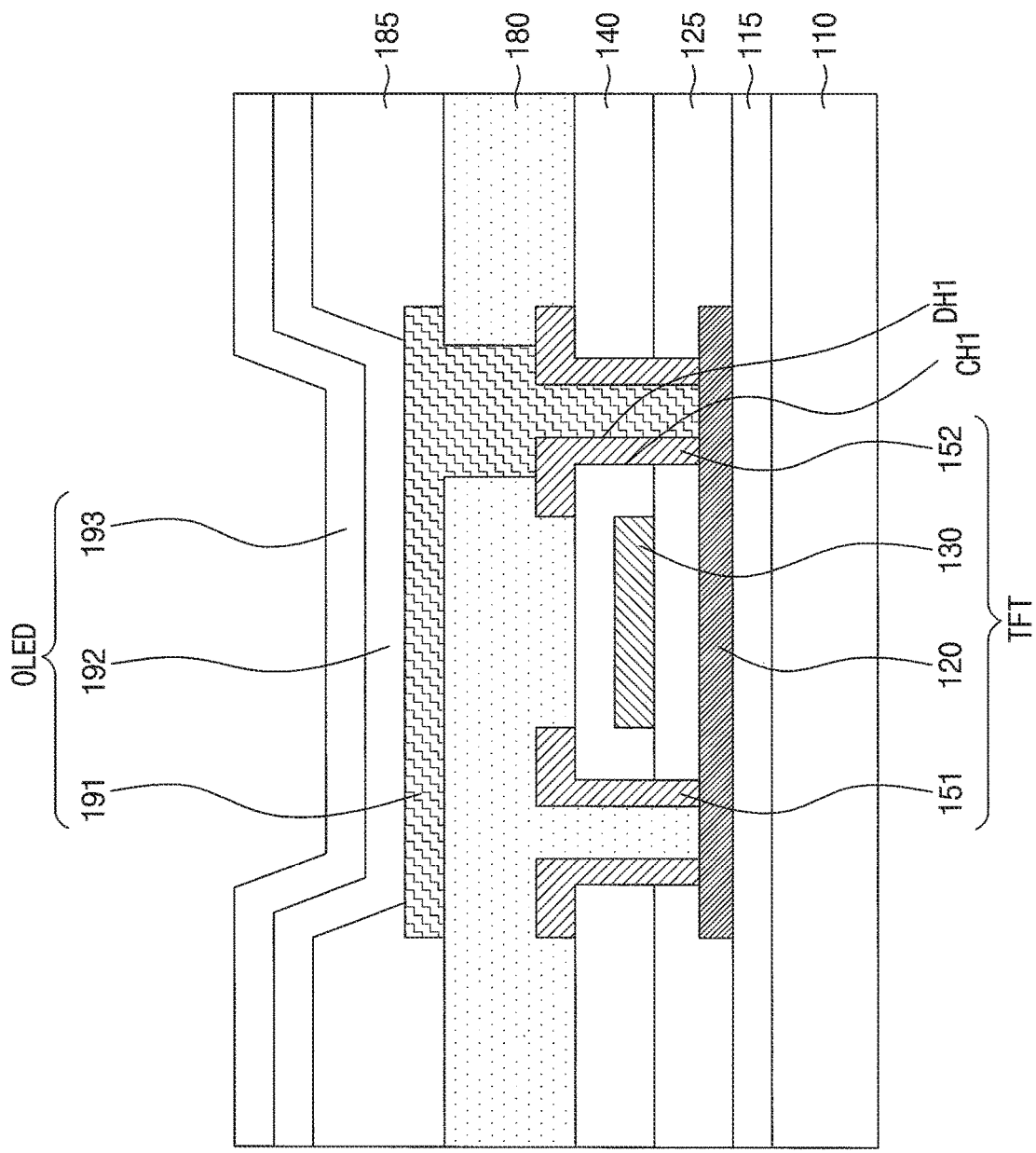
FIG. 6 is a cross-sectional view illustrating a display device according to an embodiment.

FIG. 6 is a cross-sectional view illustrating a display device according to an embodiment.

Referring to FIG. 6, a display device according to an embodiment may include the thin film transistor substrate described with reference to FIG. 1 or FIG. 4, a planarization layer 180, a pixel defining layer 185, and an organic light emitting element OLED. The organic light emitting element OLED may include a first electrode 191, an intermediate layer 192, and a second electrode 193. In an embodiment, the display device may include the thin film transistor substrate illustrated in FIG. 1. In an embodiment, the display device may include the thin film transistor substrate illustrated in FIG. 4.

The planarization layer 180 covering the thin film transistor TFT may be disposed on the insulation interlayer 140. The planarization layer 180 may provide a planarized surface. The planarization layer 180 may include photosensitive organic material. For example, the planarization layer 180 may be formed of photoresist, polyacrylate resin, polyimide-based resin, siloxane-based resin, acryl-based resin, epoxy-based resin, or the like.

The organic light emitting element OLED may be disposed on the planarization layer 180. The organic light emitting element OLED may emit light based on current supplied from the thin film transistor TFT. The display device may include an organic light emitting element. In an embodiment, the display device may include a liquid crystal element, etc. In an embodiment, the display device may include an organic light emitting element having a top emission structure, a bottom emission structure, or a double sided emission structure.

The first electrode 191 may be disposed on the planarization layer 180. The first electrode 191 may be patterned for each pixel. The first electrode 191 may be in contact with the source electrode 151 or the drain electrode 152. For example, the first electrode 191 may be in contact with the drain electrode 152 through a contact hole formed in the planarization layer 180. The first electrode 191 may be a reflective electrode. The first electrode 191 may include a reflective layer formed of at least one of silver (Ag), magnesium (Mg), aluminum (Al), platinum (Pt), palladium (Pa), gold (Au), nickel (Ni), neodymium (Nd), iridium (Ir), chrome (Cr), etc. and may include a transmissive layer formed of at least one of indium tin oxide (ITO), indium zinc oxide (IZO), zinc oxide (ZnO), indium oxide ($In_2O_3$), etc. For example, the first electrode 191 may include a multi-layered structure such as an ITO/Ag/ITO structure.

In an embodiment, the planarization layer 180 and/or the first electrode 191 may fill one or more discharge holes DH1. For example, the planarization layer 180 may fill the discharge hole DH1 defined/included in the source electrode 151, and the first electrode 191 may fill the discharge hole DH1 defined/included in the drain electrode 152. In an embodiment, the discharge holes DH1 may be filled with a conductive material, and the planarization layer 180 may cover the source electrode 151 and the drain electrode 152 in which the discharge holes DH1 are filled with the conductive material.

The pixel defining layer 185 covering the first electrode 191 may be disposed on the planarization layer 180. The pixel defining layer 185 may include an opening exposing a portion of the first electrode 191 to define an emission region. The pixel defining layer 185 may include photosensitive organic material. For example, the pixel defining layer 185 may be formed of photoresist, polyacrylate resin, polyimide-based resin, siloxane-based resin, acryl-based resin, epoxy-based resin, or the like.

The intermediate layer 192 may be disposed on the first electrode 191. The intermediate layer 192 may include an emission layer. The emission layer may be disposed in the emission region on the first electrode 191. In an embodiment, the intermediate layer 192 may further include a hole injection layer (HIL) and/or a hole transport layer (HTL) disposed between the first electrode 191 and the emission layer. In an embodiment, the intermediate layer 192 may further include an electron transport layer (ETL) and/or an electron injection layer (EIL) disposed on the emission layer. The HIL, the HTL, the ETL, and the EIL may be disposed on the first electrode 191 and the pixel defining layer 185.

The second electrode 193 may be disposed on the intermediate layer 192. The second electrode 193 may be commonly provided for the pixels. The second electrode 193 may be a transmissive electrode. For example, the second electrode 193 may be formed of metal, metal alloy, metal nitride, conductive metal oxide, transparent conductive material, or the like.

The thin film transistor substrate according to embodiments may be applied to a display device included in a computer, a notebook, a mobile phone, a smartphone, a smart pad, a PMP, a PDA, an MP3 player, or the like.

Although example embodiments have been described with reference to the drawings, the example embodiments may be modified and changed by a person having ordinary knowledge in the relevant technical field without departing from the scope defined in the following claims.

What is claimed is:

1. A thin film transistor substrate comprising:
   a base substrate;
   a semiconductor member overlapping the base substrate;
   a gate electrode overlapping the semiconductor member and insulated from the semiconductor member;
   a first insulation layer positioned on the gate electrode and including a first contact hole; and
   a source/drain electrode including a first discharge hole, electrically connected to the semiconductor member, and at least partially positioned inside the first contact hole,
   wherein the first discharge hole partially exposes the semiconductor member.

2. The thin film transistor substrate of claim 1, wherein the first discharge hole is in the first contact hole.

3. The thin film transistor substrate of claim 1, wherein a width of the first contact hole is in a range from 0.5 µm to 1.5 µm.

4. The thin film transistor substrate of claim 1, further comprising:
   a second insulation layer positioned between the gate electrode and the first insulation layer and including a second contact hole; and
   a source/drain connection electrode including a second discharge hole, electrically connected to each of the source/drain electrode and the semiconductor member, and at least partially positioned inside the second contact hole,
   wherein the second discharge hole partially exposes the semiconductor member.

5. The thin film transistor substrate of claim 4, wherein the second discharge hole is in the second contact hole.

6. The thin film transistor substrate of claim 4, wherein a width of the second contact hole is in a range from 0.5 µm to 1.5 µm.

7. The thin film transistor substrate of claim 4, wherein a width of the second contact hole is greater than a width of the first contact hole.

8. A display device comprising:
   a base substrate;
   a semiconductor member overlapping the base substrate;
   a gate electrode overlapping the semiconductor member and insulated from the semiconductor member;
   an insulation layer positioned on the gate electrode and including a contact hole;
   a source/drain electrode including a discharge hole, electrically connected to the semiconductor member, and at least partially positioned inside the contact hole;
   a planarization layer positioned on the source/drain electrode; and
   a light emitting element electrically connected to the source/drain electrode and positioned on the planarization layer,
   wherein the discharge hole partially exposes the semiconductor member.

9. The display device of claim 8, wherein the discharge hole is in the contact hole.

10. The display device of claim 8, wherein a width of the contact hole is in a range from 0.5 µm to 1.5 µm.

11. The display device of claim 8, wherein the planarization layer or an electrode of the light emitting element fills the discharge hole.

* * * * *